United States Patent
Lim et al.

(10) Patent No.: US 11,339,871 B2
(45) Date of Patent: May 24, 2022

(54) CONTACTLESS INHIBITOR SWITCH

(71) Applicant: HYUNDAI KEFICO CORPORATION, Gyeonggi-do (KR)

(72) Inventors: Seung Gu Lim, Seoul (KR); Sung Hwa Cho, Gyeonggi-do (KR); Soo Man Cho, Gyeonggi-do (KR)

(73) Assignee: HYUNDAI KEFICO CORPORATION, Gyeonggi-do (KR)

( * ) Notice: Subject to any disclaimer, the term of this patent is extended or adjusted under 35 U.S.C. 154(b) by 460 days.

(21) Appl. No.: 16/277,312

(22) Filed: Feb. 15, 2019

(65) Prior Publication Data

US 2019/0178369 A1  Jun. 13, 2019

Related U.S. Application Data

(63) Continuation of application No. PCT/KR2018/003758, filed on Mar. 30, 2018.

(51) Int. Cl.
| | |
|---|---|
| *H01H 36/00* | (2006.01) |
| *F16H 59/10* | (2006.01) |
| *F16H 59/04* | (2006.01) |
| *H03K 17/95* | (2006.01) |
| *F16H 59/08* | (2006.01) |
| *F16H 59/68* | (2006.01) |

(52) U.S. Cl.
CPC ......... *F16H 59/105* (2013.01); *F16H 59/044* (2013.01); *F16H 59/08* (2013.01); *F16H 59/68* (2013.01); *H01H 36/00* (2013.01); *H03K 17/9505* (2013.01); *H03K 17/9517* (2013.01); *H01H 2300/02* (2013.01); *H03K 2217/94068* (2013.01)

(58) Field of Classification Search
CPC . F16H 59/044; F16H 59/105; H03K 17/9505; H01H 36/00; H01H 36/0033; H01H 2300/02
See application file for complete search history.

(56) References Cited

FOREIGN PATENT DOCUMENTS

| | | |
|---|---|---|
| JP | 2002-181509 A | 6/2002 |
| JP | 2002-314144 A | 10/2002 |
| JP | 2003-185470 A | 7/2003 |
| JP | 2003-202022 A | 7/2003 |
| KR | 10-2015-0027862 A | 3/2015 |
| KR | 10-2015-0120718 A | 10/2015 |
| KR | 10-2016-0035690 A | 4/2016 |

OTHER PUBLICATIONS

International Search Report for International Patent Application No. PCT/KR2018/003758, dated Jul. 30, 2018, 4 pages.

*Primary Examiner* — Ramon M Barrera
(74) *Attorney, Agent, or Firm* — Mintz Levin Cohn Ferris Glovsky and Popeo, P.C.; Peter F. Corless

(57) ABSTRACT

An inhibitor switch is provided. The inhibitor switch includes a housing having a rotor accommodation space and a Hall element accommodation space, a rotor disposed in the rotor accommodation space, and a magnet disposed on an outer circumferential surface of the rotor. A Hall element is disposed in the Hall element accommodation space and spaced apart horizontally from the magnet with a sensing surface facing an outer circumferential surface of the magnet. Further, the inhibitor switch include a cover configured to block an opening of the rotor accommodation space to prevent the rotor from being released.

14 Claims, 7 Drawing Sheets

FIG. 1

Related Art

CONTACTLESS INHIBITOR SWITCH

CROSS-REFERENCE TO RELATED APPLICATIONS

This is a continuation application of PCT/KR2018/003758 filed on Mar. 30, 2018, which claims priority to Korean Patent Application No. KR 10-2017-0041734 filed on Mar. 31, 2017. The applications are incorporated herein by reference.

TECHNICAL FIELD

Exemplary embodiments of the present disclosure relate to a contactless inhibitor switch, and more particularly, to a contactless inhibitor switch capable of detecting a gear shift position by sensing a positional change of a magnet installed at a rotor using a Hall element.

RELATED ART

An inhibitor switch is a device for detecting a corresponding gear stage parking (P), reverse (R), neutral (N), or drive (D) when a driver manipulates a gear shift lever. The inhibitor switch is installed at a transmission case. The inhibitor switch is directly interlocked with the gear shift lever by being connected thereto through a cable or is operated by a separate actuator which is operated and controlled based on the manipulation of the gear shift lever. Gear stages information detected by the inhibitor switch is transmitted to an engine control unit and a transmission control unit and is used for various operation controls of a vehicle. For example, the inhibitor switch prevents (e.g., inhibits) a starting of the vehicle in gear shift stages R or D, and such a function is the origin of a name of the inhibitor switch.

The inhibitor switch is classified into a contact inhibitor switch and a contactless inhibitor switch. The contact inhibitor switch includes a terminal and a contactor which rub (e.g., contact) with each other. Therefore, a contact failure occurs due to abrasion and infiltration of foreign materials, and performance of sensing gear stages is degraded. In order to solve the above-described problem of the contact inhibitor switch, the contactless inhibitor switch for sensing gear stages using a Hall element has been developed.

Figure 1:
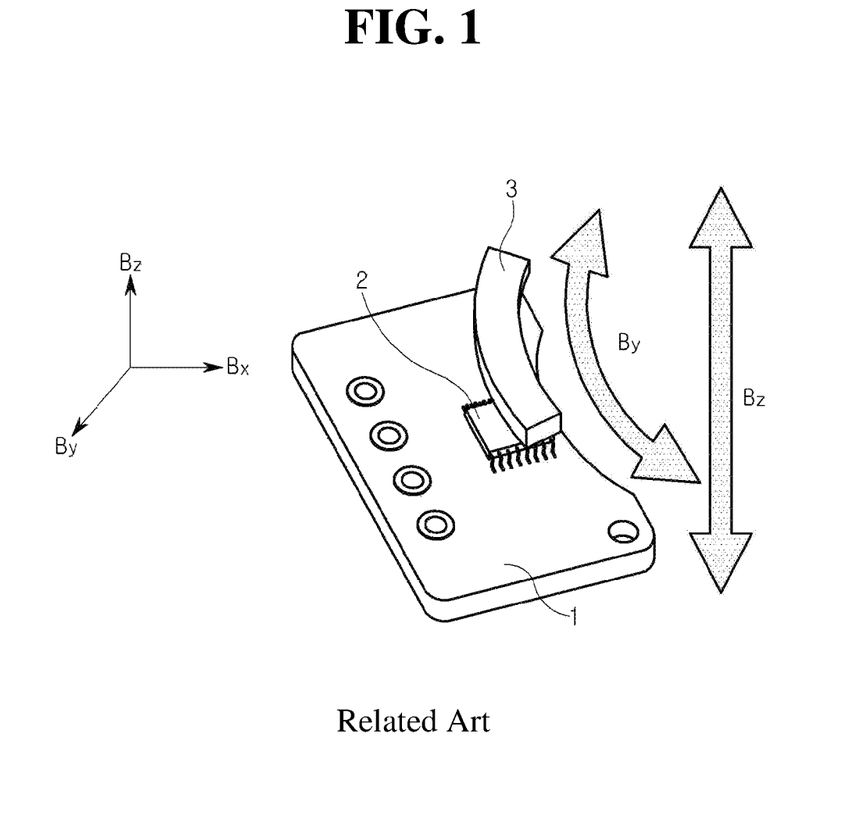
FIG. 1 is a diagram of main parts of a conventional contactless inhibitor switch in the related art.

As shown in FIG. 1, a conventional contactless inhibitor switch in the related art has a structure in which an arc-shaped magnet 3 is disposed above a Hall element 2 installed on a printed circuit board 1 (an air gap is present between the Hall element 2 and the magnet 3). The magnet 3 is installed at a rotor (not show), and a manual shaft is inserted into and installed at the rotor to allow the rotor and the magnet 3 to be integrally rotated with the manual shaft. The Hall element 2 detects a variation of position in a rotational direction of the magnet 3, and a signal that corresponds to the sensed variation is transmitted to a transmission control unit via a cable connected to the printed circuit board 1.

In this case, a magnetic flux used for sensing the variation in rotational position of the magnet 3 is a magnetic flux in a $B_y$ direction (a rotational direction of the magnet) and a $B_z$ direction (an upward-downward direction as a vertical direction between the magnet and the Hall element) in the illustrated spatial coordinate system. Therefore, when a position of the magnet 3 in the vertical direction ($B_z$ direction) is varied while the inhibitor switch is operated, a distance of the air gap between the Hall element 2 and the magnet 3 is varied, and thus, a measured magnetic flux is varied such that sensing accuracy of gear stages is degraded.

Meanwhile, as described above, the magnet 3 is installed at the rotor, and the rotor is installed at the manual shaft which is installed by passing through the inhibitor switch. However, since the manual shaft moves slightly in the vertical direction when assembled and operated, a vertical movement is also present at the magnet 3. Consequently, the distance of the air gap is varied, and sensing accuracy of the Hall element 2 is degraded.

Further, in the conventional inhibitor switch of the related art, the Hall element 2 is installed in the same space in which the magnet 3 is installed inside a housing of the conventional inhibitor switch. Since the magnet 3 is installed at the rotor which is installed at the manual shaft, and the manual shaft passes through the housing of the inhibitor switch, moisture and foreign materials enter the space in which the rotor and the magnet 3 are installed. Therefore, since the Hall element 2 installed in the same space in which the magnet 3 is installed cannot be prevented from being exposed to moisture and foreign materials, the Hall element 2 which is vulnerable to moisture is damaged, and gear stages cannot be sensed.

SUMMARY

An object of the present disclosure is to provide a contactless inhibitor switch capable of allowing a Hall element to sense gear stages regardless of a variation in vertical position of a magnet and preventing a damage to the Hall element due to infiltration of moisture and foreign materials into a space in which the magnet is installed.

In accordance with an aspect of the present disclosure, an inhibitor switch may include a housing having a rotor accommodation space and a Hall element accommodation space, a rotor disposed in the rotor accommodation space, a magnet disposed on an outer circumferential surface of the rotor, a Hall element disposed in the Hall element accommodation space and spaced apart horizontally from the magnet to allow a sensing surface to face an outer circumferential surface of the magnet, and a cover configured to block an opening of the rotor accommodation space to prevent the rotor from being released.

A partition wall may be formed between the rotor accommodation space and the Hall element accommodation space to separate an installation space of the magnet from an installation space of the Hall element. A first sealing may be disposed between an inner circumferential surface of the rotor accommodation space and upper and/or lower ends of the rotor. The Hall element accommodation space may include a Hall element insertion depression formed in a vertical direction, and the Hall element may be coupled to the Hall element insertion depression. An insulating coating material may be applied to the Hall element accommodation space, or an epoxy resin or silicone may be injected into the Hall element accommodation space and cured.

A connector may be formed at a side portion of the housing, a connector terminal may be provided inside the connector, and a Hall element-side terminal that is electrically connected to the Hall element may be connected to the connector terminal. In particular, the Hall element-side terminal may be welded to the connector terminal. An end portion of a lead that protrudes from one side surface of the Hall element may be connected to a first side surface of a capacitor and the Hall element-side terminal may be provided at a second side surface of the capacitor to constitute a Hall element assembly, and the Hall element assembly may be formed such that the lead is bent at a substantially right angle.

A fixing protrusion may be formed to protrude upward from a position adjacent to the capacitor at a bottom surface of the Hall element accommodation space, and the capacitor may be fixed to the Hall element accommodation space by deforming a free end portion of the fixing protrusion while in close contact with the bottom surface of the Hall element accommodation space. At least two fixing protrusions may be formed at positions adjacent to both sides of the capacitor to which the lead and the Hall element-side terminal are not connected.

A plurality of coupling apertures may be formed at the cover along an outer circumference thereof, a plurality of coupling protrusions may be formed to protrude from a bottom of the housing to correspond to the plurality of coupling apertures. The plurality of coupling protrusions may be inserted to pass through the plurality of coupling apertures, and free end portions of the plurality of coupling protrusions may be deformed to couple the cover with the rotor accommodation space.

Alternatively, a plurality of coupling apertures may be formed at the housing along an edge of an upper portion of the rotor accommodation space, a plurality of coupling protrusions may be formed to protrude from the cover to correspond to the plurality of coupling apertures. The plurality of coupling protrusions may be inserted to pass through the plurality of coupling apertures, and free end portions of the plurality of coupling protrusions may be deformed to couple the cover with the rotor accommodation space.

The rotor may be inserted from a lower end of the rotor accommodation space toward an upper end thereof. Alternatively, the rotor may be inserted from an upper end of the rotor accommodation space toward a lower end thereof, and a second sealing may be disposed between the upper end of the rotor accommodation space of the housing and the cover.

As described above, in accordance with the present disclosure, a vertical flux component may be not used to sense a variation in position of a magnet, and therefore, even though a vertical movement of the magnet is present, gear stages may be detected regardless of the vertical movement of the magnet. Further, the Hall element may be sealed and protected from moisture and foreign materials that enter a space in which the magnet is installed, and therefore, a damage to the Hall element may be prevented, and gear stages may be detected more accurately.

BRIEF DESCRIPTION OF THE DRAWINGS

A brief description of each drawing is provided to more sufficiently understand drawings used in the detailed description of the present disclosure.

DETAILED DESCRIPTION

The present disclosure may be modified into various forms and may have a variety of embodiments, and, therefore, exemplary embodiments will be illustrated in the drawings and described in detail. The exemplary embodiments, however, are not to be taken in a sense which limits the present disclosure to the exemplary embodiments, and should be construed to include modifications, equivalents, or substitutes within the spirit and technical scope of the present disclosure. For clarity and convenience of description, thickness of lines and sizes of components shown in the accompanying drawings may be exaggerated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, all terms used hereinafter are defined by considering functions in the present disclosure, and meanings thereof may be different based on a user, the intent of an operator, or custom. Therefore, definitions of these terms should follow contexts disclosed herein.

Figure 2:
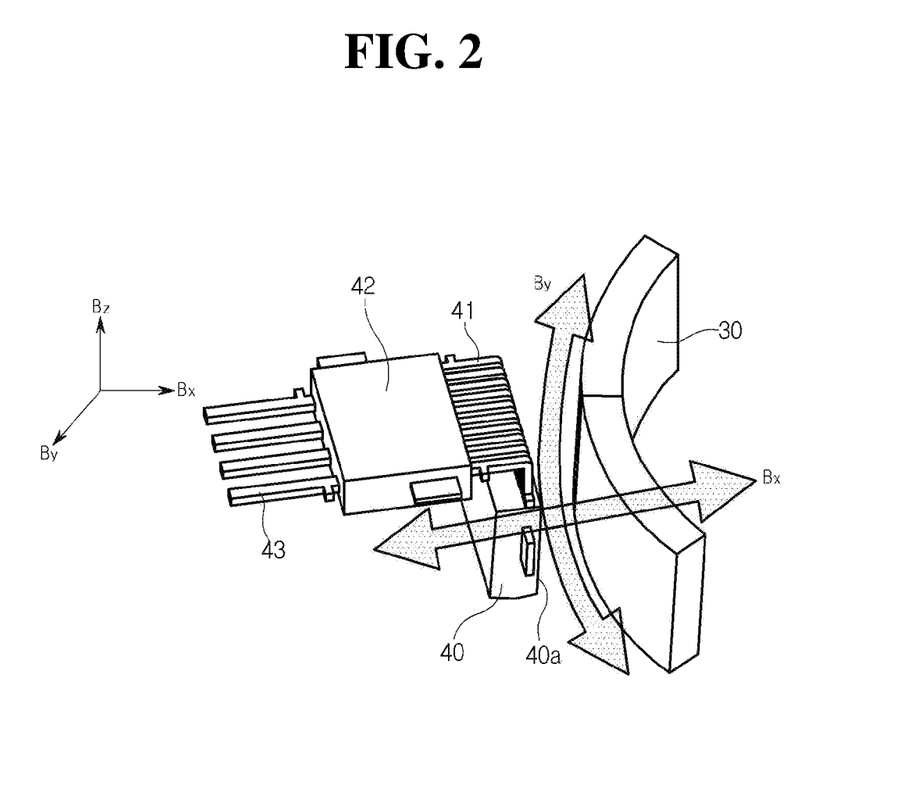
FIG. 2 is a diagram of main parts of a contactless inhibitor switch according to an exemplary embodiment of the present disclosure.

Hereinafter, exemplary embodiments of the present disclosure will be described in detail with reference to the accompanying drawings. FIG. 2 is a diagram of main parts of a contactless inhibitor switch according to the present disclosure. As shown in FIG. 2, the inhibitor switch according to the present disclosure may include a magnet 30 installed at a rotor, and a Hall element 40 disposed to face the magnet 30 by being spaced in a horizontal direction with respect to the magnet 30 with a gap between the magnet 30 and the Hall element 40. The present disclosure is not limited thereto, and the magnet 30 may be in the form of an arc shape of which a vertical length is greater than a thickness in a radial direction. Hereinafter, an example of the magnet 30 having an arc shape will be described.

The Hall element 40 may be disposed at a position spaced apart by a predetermined distance (e.g., a gap) from an outer circumferential surface of the magnet 30 in the horizontal direction. The Hall element 40 may be an element for converting a magnetic charge into an electric voltage using a Hall effect. The Hall element 40 may be a chip that embeds an integrated circuit (IC) used for measuring an intensity of a magnetic field or measuring a current or a position based on a variation in magnetic field.

A plurality of leads 41 may protrude from one side surface of the Hall element 40. An upper surface of the Hall element 40 among the upper surface and a lower surface thereof perpendicular to the protruding direction of the plurality of leads 41 may include a sensing surface 40a for sensing a magnetic field. Since the upper surface of the Hall element 40 is disposed to be closer to the magnet 30, the upper surface of the Hall element 40 may include the sensing surface 40a. As described above, FIG. 2 illustrates an example in which the Hall element 40 is disposed vertically to face the outer circumferential surface of the magnet 30 by allowing the upper surface of the Hall element 40 to serve as the sensing surface 40a. The present disclosure is not limited thereto. Hereinafter, the example in which the upper surface of the Hall element 40 serves as the sensing surface 40a will be described.

Figure 5:
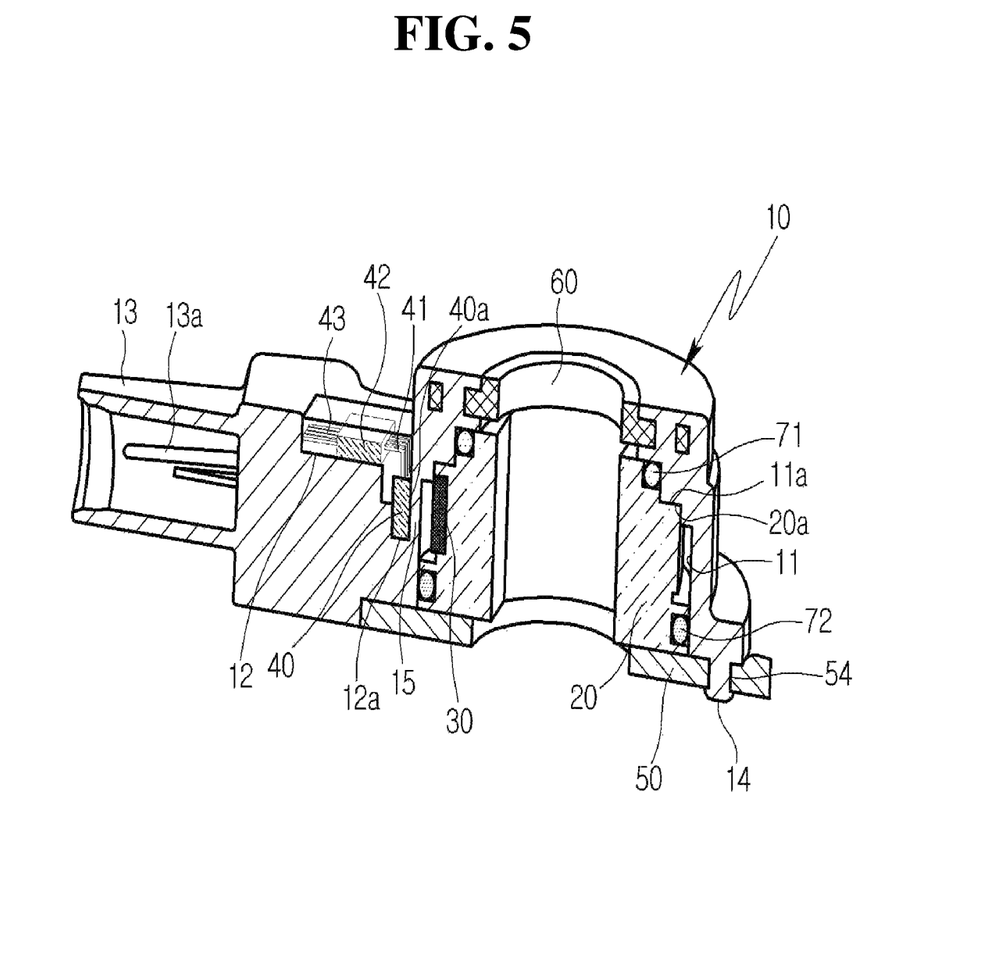
FIG. 5 is a longitudinal sectional view of the inhibitor switch according to an exemplary embodiment of the present disclosure.

Since the Hall element 40 is disposed vertically to allow the upper surface of the element 40 to serve as the sensing surface 40a, the plurality of leads 41 of the Hall element 40 may protrude upward, and therefore, to connect the plurality of leads 41 to a connector terminal 13a of a connector 13 which is formed at a side portion of a housing, the plurality of leads 41 may be bent to extend in the horizontal direction (See FIGS. 2 and 5). The horizontal portions of the plurality of bent leads 41 may be connected to a first side surface of the capacitor 42 for obtaining capacitance. A Hall element-side terminal 43 for connecting to the connector terminal 13a may be provided on a second side surface of the capacitor 42.

An overall configuration and an internal structure of the inhibitor switch according to the present disclosure including the magnet 30 and the Hall element 40 will be described with reference to FIGS. 3 to 7. The inhibitor switch according to the present disclosure may include a housing 10 having a rotor accommodation space 11, a Hall element accommodation space 12, and the connector 13. The inhibitor switch may also include a rotor 20 disposed in the rotor accommodation space 11, the arc-shaped magnet 30 disposed on an outer circumferential surface of the rotor 20, the Hall element 40 disposed in the Hall element accommodation space 12, and a cover 50 for preventing the rotor 20 from being released by blocking an opening of the rotor accommodation space 11 after the rotor 20 is inserted into the rotor accommodation space 11. The Hall element 40 may be installed vertically to allow the sensing surface 40a to face an outer circumferential surface of the magnet 30 while having a predetermined distance (e.g., a gap) from the outer circumferential surface of the magnet 30.

As described above, since the capacitor 42 is provided at the lead 41 that protrudes from one side surface of the Hall element 40, and the Hall element-side terminal 43 protrudes from the first side surface of the capacitor 42, the lead 41 may be bent in the horizontal direction to connect the connector terminal 13a of the connector 13 formed at a side portion of the housing 10 to the Hall element-side terminal 43. Therefore, a Hall element assembly (including the Hall element 40, the lead 41, the capacitor 42, and the Hall element-side terminal 43) may have a rotated "L" shape, and thus the Hall element accommodation space 12 into which the Hall element assembly is inserted and installed may also have the rotated "L" shape to allow the Hall element assembly to be depressed and installed downward from an upper surface of the housing 10 to an interior thereof.

Accordingly, the Hall element 40 may be fixed to a Hall element insertion depression 12a which is a vertical depression (e.g., recess) portion of the Hall element accommodation space 12. The Hall element 40 may be inserted into the Hall element insertion depression 12a by being press-inserted into the Hall element insertion depression 12a having a width that is substantially equal to a width of the Hall element 40, and the Hall element 40 may be fixed to the Hall element accommodation space 12 to suppress a left-right movement (horizontal direction) of the Hall element 40.

Figure 7:
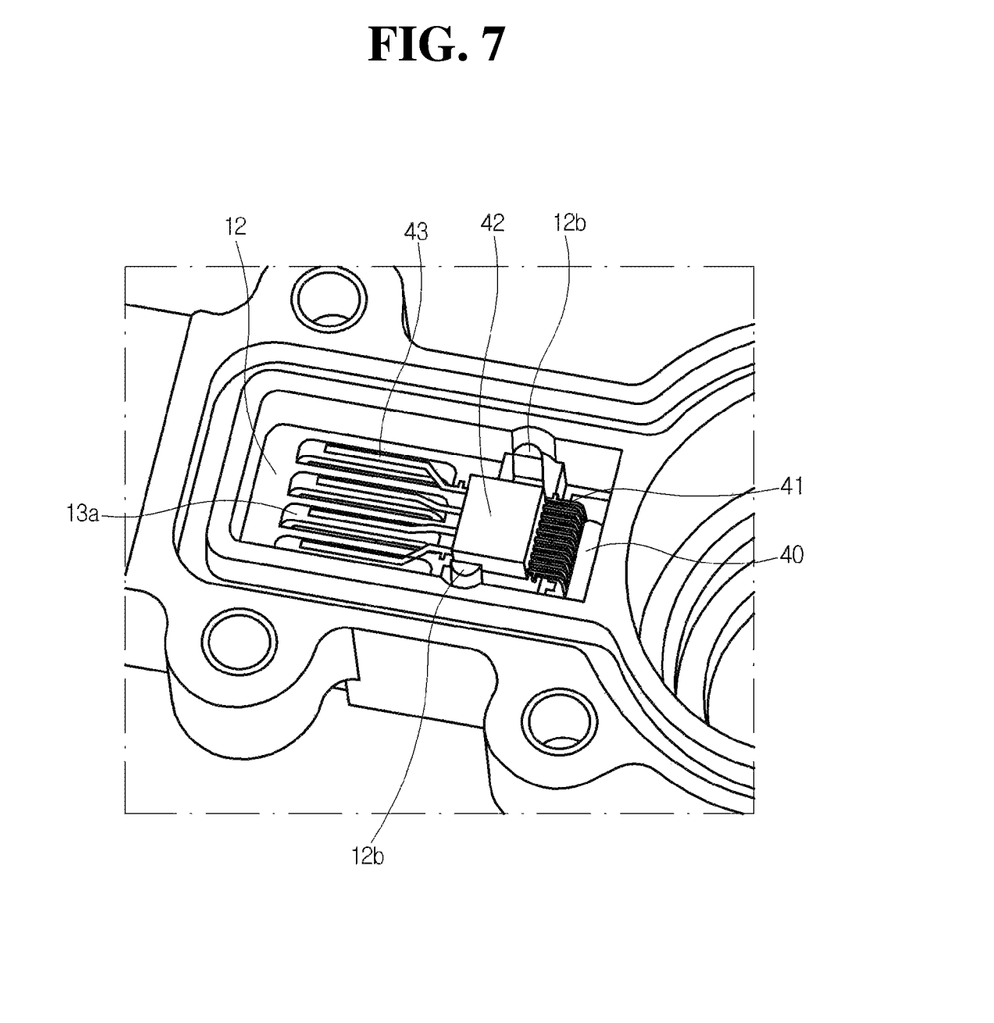
FIG. 7 is a partially enlarged view of FIG. 5 according to an exemplary embodiment of the present disclosure.

Further, as shown in FIG. 7, both side surfaces of the capacitor 42 may be fixed through hot caulking with a lower surface of the capacitor 42 abutting a horizontal bottom surface of the Hall element accommodation space 12 to allow the capacitor 42 to be fixed and installed in the vertical direction as well as the horizontal direction, and thus, the vertical movement of the Hall element 40 may also be suppressed.

Hot caulking may be performed such that heat and pressure are applied to at least one fixing protrusions 12b which are formed to protrude from the horizontal bottom surface of the Hall element accommodation space 12 in an upward direction to deform free end portions of the fixing protrusions 12b, thereby allowing the deformed free end portions thereof to abut both of the side surfaces and an upper surface of the capacitor 42. The fixing protrusions may be provided in one, two, or more. To prevent interference with the lead 41 or the Hall element-side terminal 43, a pair of fixing protrusions 12b may be disposed at positions adjacent to both of the side surfaces of the capacitor 42 to which the lead 41 and the Hall element-side terminal 43 are not connected.

The Hall element-side terminal 43 that protrude from the capacitor 42 may be welded and connected to one end portion of the connector terminal 13a provided inside the connector 13. Resistance welding or laser welding may be used as a welding method.

Further, to prevent an electrical connection of the leads 41 or the Hall element-side terminals 43 due to moisture or foreign materials that enter the Hall element accommodation space 12 after welding is completed, a coating solution of an insulating material may be applied to the Hall element accommodation space 12 or a filler made of a resin or silicone material may be injected into the Hall element accommodation space 12. An example in which a filler made of a resin or silicon material is injected and cured as a means for preventing an inflow of moisture or foreign materials into the Hall element accommodation space 12 will be described below.

An epoxy resin may be used as a filler made of a resin material, but the present disclosure is not limited thereto. As described above, when an epoxy resin or silicone is injected and cured, the Hall element accommodation space 12 may be sealed from infiltration of moisture and foreign materials, and also a space between the leads 41 or the Hall element-side terminals 43 may be covered to prevent an electrical contact between the leads 41 or the Hall element-side terminals 43. The cured epoxy resin or silicone may also fix the Hall element assembly to an interior of the Hall element accommodation space 12.

The rotor accommodation space 11 may be a cylindrical space formed at one side of the Hall element accommodation space 12 in the housing 10. The rotor 20 inserted and installed into the rotor accommodation space 11 may also include a cylindrical shape to allow the rotor 20 to be rotatable inside the rotor accommodation space 11. Stopping protrusions 11a and 20a that correspond to each other may be respectively formed on an inner circumferential surface of the rotor accommodation space 11 and an outer circumferential surface of the rotor 20 to suppress a vertical movement of the rotor 20.

Figure 6:
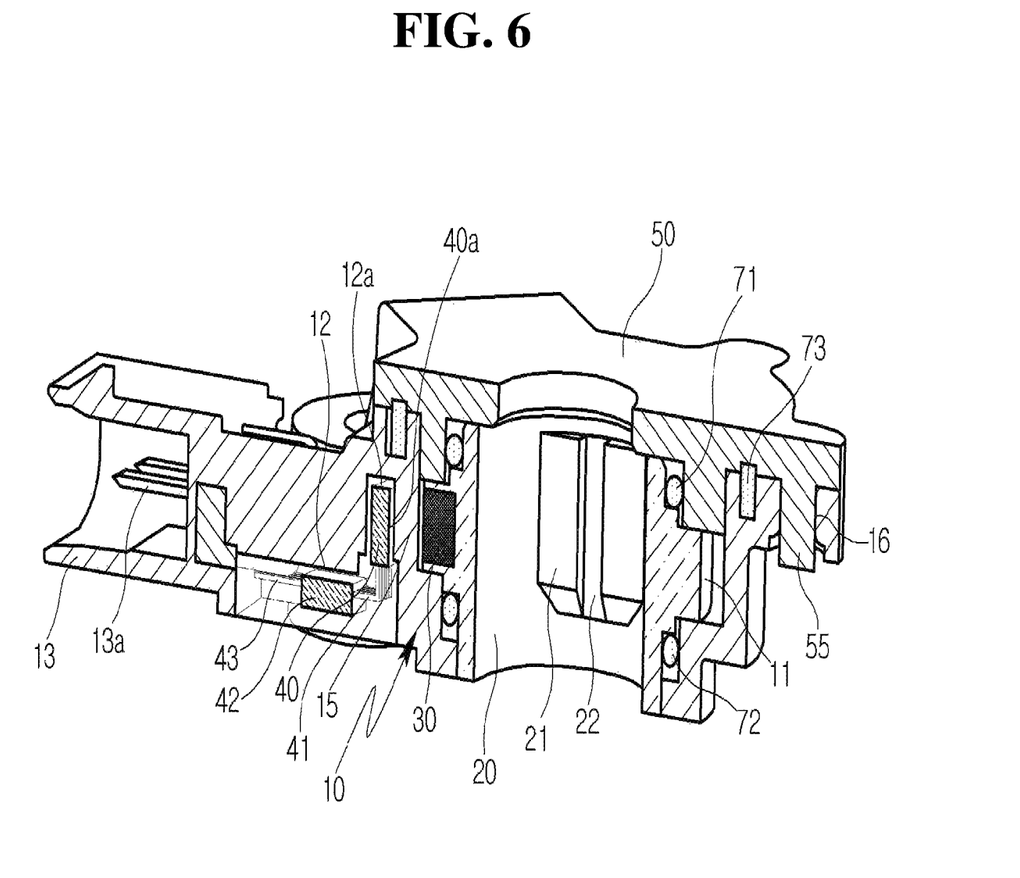
FIG. 6 is a longitudinal sectional view of an inhibitor switch according to another exemplary embodiment of the present disclosure.

The rotor 20 may be inserted upward from a lower portion of the rotor accommodation space 11 or may be inserted downward from an upper portion thereof. FIG. 5 illustrates an example in which the rotor 20 is inserted upward from the lower portion of the rotor accommodation space 11, and FIG. 6 illustrates an example in which the rotor 20 is inserted downward from the upper portion of the rotor accommodation space 11. The cover 50 may be installed at a bottom opening or a top opening of the rotor accommodation space 11 to prevent the rotor 20 from being released upward or downward. The cover 50 may suppress the rotor 20 from being released from the rotor accommodation space 11, and the vertical movement of the rotor 20 may be suppressed by the stopping protrusions 11a and 20a and the cover 50. Accordingly, a vertical movement of the magnet 30 installed on the outer circumferential surface of the rotor 20 may also be prevented. As described above, the vertical movement of the rotor 20 may be prevented, and a vertical movement of a manual shaft inserted into and coupled to the rotor 20 may be prevented.

An aperture may be formed in the rotor 20 in the vertical direction, and the upper and lower portions of the rotor accommodation space 11 and a central portion of the cover 50 may be open to allow the aperture to be open in the vertical direction.

Figure 3:
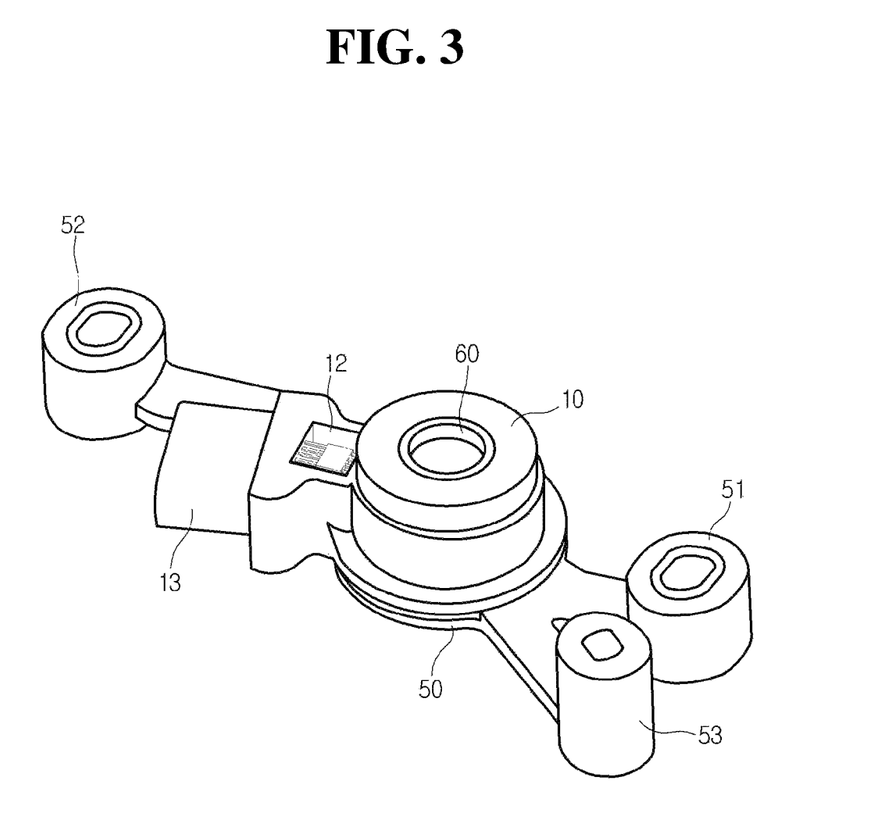
FIG. 3 is a top perspective view of the inhibitor switch according to an exemplary embodiment of the present disclosure.
Figure 4:
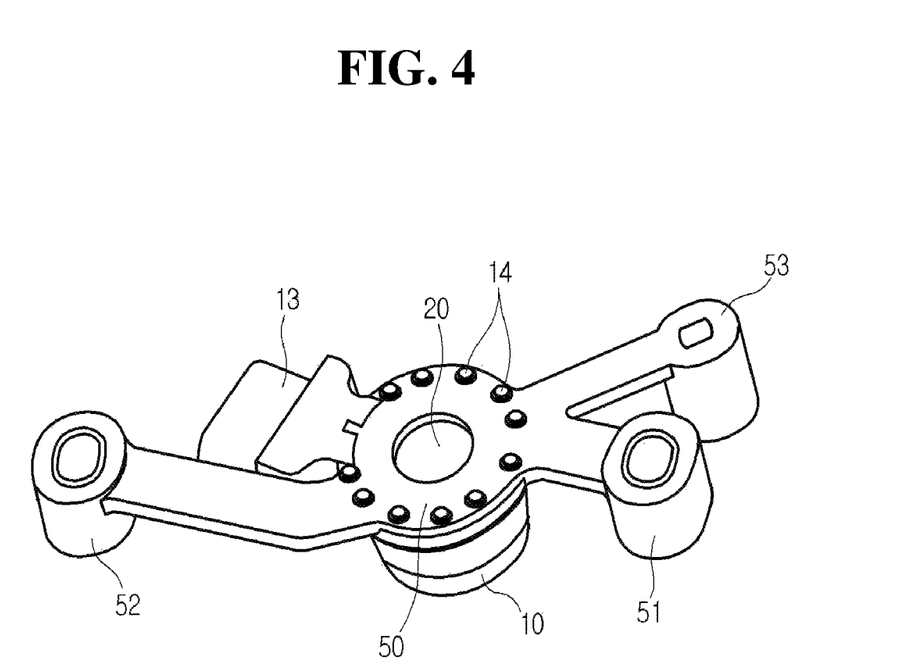
FIG. 4 is a bottom perspective view of the inhibitor switch according to an exemplary embodiment of the present disclosure.

In regard to a coupling method between the cover 50 and the housing, FIGS. 3 to 5 illustrate an example in which a plurality of coupling apertures 54 are formed to pass through the cover 50 along the outer circumference thereof. A plurality of coupling protrusions 14 may be formed to protrude from bottom portions of the housing 10 to correspond to the plurality of coupling apertures 54, the plurality of coupling protrusions 14 may be inserted into the plurality of coupling apertures 54 to pass therethrough, and subsequently, free end portions of the plurality of coupling protrusions 14 may be deformed to couple the cover 50 with the housing 10.

As a coupling method using physical deformation, a hot caulking method of applying heat and pressure to deform the free end portions of the plurality of coupling protrusions 14, or a riveting method of deforming the free end portions of the plurality of coupling protrusions 14 using pressure or a rotational force may be applied. The hot caulking method may be applicable when the plurality of coupling protrusions 14 are formed of plastic materials, and the riveting method may be applicable when the plurality of coupling protrusions 14 are formed of metal materials such as aluminum. Alternatively, a coupling aperture may be formed at a bottom portion of the housing 10, and a coupling protrusion may be formed to protrude from the cover 50 at a position that corresponds to a position of the coupling aperture. For convenience of description, as shown in the drawings, an example in which the plurality of coupling apertures 54 are formed in the cover 50 and the plurality of coupling protrusions 14 are formed to protrude from the bottom portion of the housing 10 will be described below.

As shown in FIGS. 3 and 4, a plurality of mounting parts 51 and 52 and a rotor position setting part 53 may be formed in the cover 50. The plurality of mounting parts 51 and 52 and the rotor position setting part 53 may be formed at end portions of protruding pieces that protrude radially outward from an outer circumferential surface of the disk-shaped cover 50. Each of the two mounting parts 51 and 52 may be disposed at opposite sides of the cover 50 for installation stability of the inhibitor switch, and the rotor position setting part 53 may be formed at a position that faces the mounting part 51 at a side portion of the cover 50.

The mounting parts 51 and 52 may be fixed to a transmission case via fastening means such as bolts or screws to install the inhibitor switch at the transmission case. When the inhibitor switch is assembled with the transmission case, the rotor position setting part 53 may fix a position of a lever disposed in the manual shaft to align (e.g., orient) with the rotor 20 to be disposed at an N stage position. When an aperture of the lever is aligned with an aperture of the rotor position setting part 53 (aligned by inserting a pin during assembly), the rotor 20 may be disposed at the position of the N stage.

When assembled, the Hall element 40 and the magnet 30 may be separated by the partition wall 15. The partition wall 15 may be a portion of the housing 10 to form the rotor accommodation space 11. Due to the partition wall 15, a space in which the rotor 20 and the magnet 30 are installed (the rotor accommodation space 11) may be separated from a space in which the Hall element 40 is installed (the Hall element accommodation space 12). Therefore, moisture and foreign materials that enter the rotor accommodation space 11 may be prevented from affecting the Hall element 40 to protect the Hall element 40 and prevent a damage thereto. FIG. 5 illustrates that the magnet 30 and the Hall element 40 are disposed to face each other in the horizontal direction.

First sealings 71 and 72 may be provided on outer circumferential surfaces of upper and lower ends of the rotor 20. The first sealings 71 and 72 may block infiltration of moisture and foreign materials from the exterior into an interior of the rotor accommodation space 11 by sealing a gap between the inner circumferential surfaces of the rotor 20 and the rotor accommodation space 11. The first sealings 71 and 72 may be provided in the form of an O-ring seal, a quad ring seal, or an oil seal. FIGS. 5 and 6 illustrate examples in which O-rings are provided as the first sealings 71 and 72.

Further, a washer 60 may be disposed at the top opening of the rotor accommodation space 11. The washer 60 may be insert-molded when the housing 10 is injection-molded. The washer 60 may support the manual shaft inserted into the rotor 20 in a transverse direction (i.e., horizontal direction) along with the cover 50. When the cover 50 formed of a plastic material is applied, stiffness of the cover 50 may be improved due to the washer 60.

As described above, since the manual shaft is supported at two vertical points in the horizontal direction by the washer 60 and the cover 50, a transverse direction (i.e., a horizontal) movement of the manual shaft may be suppressed, and thus, the horizontal movement of the rotor 20 installed at the manual shaft may be prevented, and a horizontal movement of the magnet 30 installed at the rotor 20 may be prevented. Therefore, a horizontal distance (i.e., gap) between the magnet 30 and the Hall element 40 may be maintained constant to improve the sensing performance of the Hall element 40, and thus, sensing of gear stages of the inhibitor switch may be more accurately performed.

According to the above-described configuration, the Hall element 40 according to the present disclosure may detect a position in a rotational direction of the magnet 30 using only magnet fluxes in the $B_y$ direction (a rotational direction of the magnet) and the $B_x$ direction (the horizontal direction between the magnet and the Hall element) in the spatial coordinate system shown in FIG. 2. As described above, since a magnetic flux component in the $B_z$ direction (the vertical direction) is not used to detect positions of gear stages, even when a vertical movement occurs at the manual shaft and thus a vertical position of the magnet 30 is varied, the positions of gear stages may be more accurately detected regardless of the vertical movement of the magnet 30.

FIG. 6 illustrates another example of the inhibitor switch according to the present disclosure. In order to exclude or minimize a magnetic flux component in the vertical direction (the $B_z$ direction), a structure in which the Hall element 40 is installed in the vertical direction and the sensing surface 40a of the Hall element 40 is installed to face the magnet 30 in the horizontal direction (the $B_x$ direction) may be the same as the structure of the above-described example.

Referring to FIG. 6, the Hall element assembly may be inserted upward from the lower surface of the housing 10 into the Hall element accommodation space 12. Similar to the above-described example, the Hall element 40 may be vertically press-inserted into the Hall element insertion depression 12a, and the capacitor 42 may be fixed on an inner horizontal surface of the Hall element accommodation space 12 using the fixing protrusion 12b by hot caulking. An epoxy resin or silicone may be injected into the Hall element accommodation space 12 to block infiltration of foreign materials and moisture, to prevent an electrical contact between the leads 41 or the Hall element-side terminals 43, and to fix the Hall element assembly.

As described above, when the Hall element accommodation space 12 and the Hall element 40 are disposed at a lower portion of the housing 10, infiltration of moisture and foreign materials may be prevented. Since the moisture and foreign materials tend to move in the direction of gravity (a vertically downward direction) unless another external force acts thereon, it is more difficult for the moisture and foreign materials to move upward and enter the interior of the Hall element accommodation space 12.

Further, the example shown in FIG. 6 is configured such that the rotor 20 is inserted downward from the upper portion of the rotor accommodation space 11, and the cover 50 is installed at the upper portion of the rotor accommodation space 11 to prevent the rotor 20 from being released upward.

In regard to a coupling method between the cover 50 and the housing 10, similar to the example shown in FIGS. 3 to 5, the cover 50 and the housing 10 may be coupled to each other by hot caulking or riveting. FIG. 6 illustrates an example in which a coupling aperture 16 is formed at an upper edge portion of the rotor accommodation space 11 of the housing 10, a coupling protrusion 55 that corresponds to the coupling aperture 16 is formed at the cover 50, the coupling protrusion 55 is inserted into the coupling aperture 16, and subsequently, a free end portion of the coupling protrusion 55 is deformed to couple the cover 50 with the housing 10. Further, when the cover 50 is installed at the upper portion of the housing 10, a second sealing 73 may be disposed between the cover 50 and the housing 10.

Meanwhile, a coupling surface part 21 for fixing the rotor 20 to the manual shaft in a rotational direction may be formed to protrude from an inner circumferential surface of the aperture of the rotor 20. The coupling surface part 21 may protrude in a plane shape constituting a chord with respect to the inner circumferential surface of the aperture of the rotor 20. A corresponding surface in close surface contact with the coupling surface part 21 may be formed on the outer circumferential surface of the manual shaft. Further, a coupling depression 22 may be formed at the coupling surface part 21 in the vertical direction (an insertion direction of the manual shaft), and a vertical coupling protrusion that corresponds to the coupling depression 22 and to be inserted thereinto may be formed on the corresponding surface of the manual shaft.

As described above, when the manual shaft is inserted into the aperture of the rotor 20, the coupling surface part 21 of the rotor 20 may be brought into close surface contact with the corresponding part of the manual shaft. Since the vertical coupling protrusion of the manual shaft is inserted into the coupling depression 22 of the rotor 20, the rotor 20 and the manual shaft may be coupled to each other to prevent the manual shaft from becoming loose (e.g., rotating uncoupled) with respect to the rotor 20. Therefore, a rotation of the manual shaft may be more accurately transmitted to the magnet 30 through the rotor 20, and thus a discrepancy in rotation amount between manual shaft and the magnet 30 may be prevented from occurring, and the positions of gear stages may be more accurately sensed.

While the present disclosure has been described with reference to the exemplary embodiments shown in the drawings, these are merely illustrative, and those skilled in the art to which the present disclosure pertains will understood that various modifications and equivalent other embodiments can be implemented within the spirit and scope of the present disclosure. Accordingly, the technical scope of the present disclosure should be determined by the following claims.

What is claimed is:

1. An inhibitor switch comprising:
a housing having a rotor accommodation space and a Hall element accommodation space;
a rotor disposed in the rotor accommodation space;
a magnet disposed on an outer circumferential surface of the rotor;
a Hall element disposed in the Hall element accommodation space and spaced apart horizontally from the magnet with a sensing surface facing an outer circumferential surface of the magnet; and
a cover configured to block an opening of the rotor accommodation space to prevent the rotor from being released,
wherein a first side surface of a capacitor is connected to an end portion of a lead that protrudes from one side surface of the Hall element,
wherein a second side surface of the capacitor is connected to a connector disposed at a side portion of the housing, and
wherein the lead is bent at a substantially right angle.

2. The inhibitor switch of claim 1, further comprising:
a partition wall formed between the rotor accommodation space and the Hall element accommodation space and configured to separate an installation space of the magnet from an installation space of the Hall element.

3. The inhibitor switch of claim 1, further comprising:
a first sealing disposed between an inner circumferential surface of the rotor accommodation space and upper or lower ends of the rotor.

4. The inhibitor switch of claim 1, wherein the Hall element accommodation space includes a Hall element insertion depression formed in a vertical direction, and the Hall element is coupled to the Hall element insertion depression.

5. The inhibitor switch of claim 1, wherein an insulating coating material is applied to the Hall element accommodation space, or an epoxy resin or silicone is injected into the Hall element accommodation space and cured.

6. The inhibitor switch of claim 1, further comprising:
a connector terminal disposed within the connector; and
a Hall element-side terminal electrically connected to the Hall element, wherein the Hall element-side terminal is connected to the connector terminal.

7. The inhibitor switch of claim 6, wherein the Hall element-side terminal is welded to the connector terminal.

8. The inhibitor switch of claim 6, wherein the Hall element-side terminal is provided at the second side surface of the capacitor to form a Hall element assembly.

9. The inhibitor switch of claim 8, further comprising:
a fixing protrusion formed to protrude upward from a position adjacent to the capacitor at a bottom surface of the Hall element accommodation space,
wherein the capacitor is fixed to the Hall element accommodation space by deforming a free end portion of the fixing protrusion while in close contact with the bottom surface of the Hall element accommodation space.

10. The inhibitor switch of claim 9, wherein at least two fixing protrusions are formed at positions adjacent to both sides of the capacitor to which the lead and the Hall element-side terminal are not connected.

11. The inhibitor switch of claim 1, further comprising:
a plurality of coupling apertures formed at the cover along an outer circumference thereof; and
a plurality of coupling protrusions formed to protrude from the housing to correspond to the plurality of coupling apertures,
wherein the plurality of coupling protrusions are inserted to pass through the plurality of coupling apertures, and free end portions of the plurality of coupling protrusions are deformed to couple the cover with the rotor accommodation space.

12. The inhibitor switch of claim 1, further comprising:
a plurality of coupling apertures formed in the housing along an outer circumference of the rotor accommodation space; and
a plurality of coupling protrusions formed to protrude from the cover to correspond to the plurality of coupling apertures,
wherein the plurality of coupling protrusions are inserted to pass through the plurality of coupling apertures, and free end portions of the plurality of coupling protrusions are deformed to couple the cover with the rotor accommodation space.

13. The inhibitor switch of claim 1, wherein the rotor is inserted from a lower end of the rotor accommodation space toward an upper end thereof.

14. The inhibitor switch of claim 1, wherein the rotor is inserted from an upper end of the rotor accommodation space toward a lower end thereof, and a sealing is disposed between the upper end of the rotor accommodation space of the housing and the cover.

\* \* \* \* \*